(12) United States Patent
Okamoto

(10) Patent No.: US 9,875,952 B2
(45) Date of Patent: Jan. 23, 2018

(54) POWER CONVERSION DEVICE

(71) Applicant: FUJI ELECTRIC CO., LTD., Kawasaki-shi (JP)

(72) Inventor: Kenji Okamoto, Hachioji (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 4 days.

(21) Appl. No.: 15/066,545

(22) Filed: Mar. 10, 2016

(65) Prior Publication Data

US 2016/0190034 A1   Jun. 30, 2016

Related U.S. Application Data

(63) Continuation of application No. PCT/JP2015/054904, filed on Feb. 23, 2015.

(30) Foreign Application Priority Data

Mar. 31, 2014   (JP) .................. 2014-071982

(51) Int. Cl.
| | |
|---|---|
| *H01L 23/367* | (2006.01) |
| *H01L 23/498* | (2006.01) |
| *H01L 23/373* | (2006.01) |
| *H01L 23/043* | (2006.01) |

(Continued)

(52) U.S. Cl.
CPC ........ *H01L 23/3675* (2013.01); *H01L 23/043* (2013.01); *H01L 23/13* (2013.01); *H01L 23/3677* (2013.01); *H01L 23/3731* (2013.01); *H01L 23/3735* (2013.01); *H01L 23/49827* (2013.01); *H01L 23/49838* (2013.01); *H01L 25/07* (2013.01); *H01L 2224/48091* (2013.01);

(Continued)

(58) Field of Classification Search
None
See application file for complete search history.

(56) References Cited

U.S. PATENT DOCUMENTS

| | | | |
|---|---|---|---|
| 5,703,399 A | 12/1997 | Majumdar et al. | |
| 6,559,536 B1 * | 5/2003 | Katoh | H01L 23/3128 |
| | | | 257/675 |

(Continued)

FOREIGN PATENT DOCUMENTS

| | | |
|---|---|---|
| EP | 2 835 823 A1 | 2/2015 |
| JP | H09-139461 A | 5/1997 |

(Continued)

OTHER PUBLICATIONS

PCT, "International Search Report for International Application No. PCT/JP2015/054904".

*Primary Examiner* — William Coleman
*Assistant Examiner* — Kien Ly
(74) *Attorney, Agent, or Firm* — Manabu Kanesaka

(57) ABSTRACT

A power conversion device includes a heat releasing heatsink, a printed circuit board provided on the heatsink and having a through hole and wires, a metal case having a depressed portion fitted in the through hole and mounted on a top of the heatsink, and a heat releasable insulating layer made of a ceramic material and disposed between a bottom of the depressed portion and a top portion of the heat sink. A power semiconductor element is mounted in the depressed portion and electrically connected to the wires of the printed circuit board.

14 Claims, 6 Drawing Sheets

(51) Int. Cl.
  *H01L 23/13*  (2006.01)
  *H01L 25/07*  (2006.01)
(52) U.S. Cl.
  CPC ............... *H01L 2224/48227* (2013.01); *H01L 2924/19107* (2013.01)

(56) References Cited

U.S. PATENT DOCUMENTS

| | | | | |
|---|---|---|---|---|
| 6,650,559 | B1* | 11/2003 | Okamoto | H01L 23/3672 257/E23.103 |
| 9,433,075 | B2* | 8/2016 | Fujino | H01L 24/37 |
| 2006/0108601 | A1* | 5/2006 | Okamoto | C23C 4/02 257/177 |
| 2012/0012880 | A1* | 1/2012 | Lee | H01L 33/642 257/98 |
| 2015/0021750 | A1* | 1/2015 | Fujino | H01L 23/24 257/667 |
| 2015/0262902 | A1* | 9/2015 | Shen | H01L 23/315 438/107 |
| 2015/0262972 | A1* | 9/2015 | Katkar | H01L 21/561 257/48 |
| 2016/0141231 | A1* | 5/2016 | Yoshihara | H01L 23/49548 257/676 |

FOREIGN PATENT DOCUMENTS

| | | | |
|---|---|---|---|
| JP | H11-191603 A | | 7/1999 |
| JP | 2003-197835 A | * | 7/2003 |
| JP | 2009-076750 A | * | 4/2009 |
| WO | 2013/065316 A1 | | 5/2013 |
| WO | 2013/150772 A1 | | 10/2013 |
| WO | WO 2015193153 A1 | * | 12/2015 ......... H01L 23/3677 |

* cited by examiner

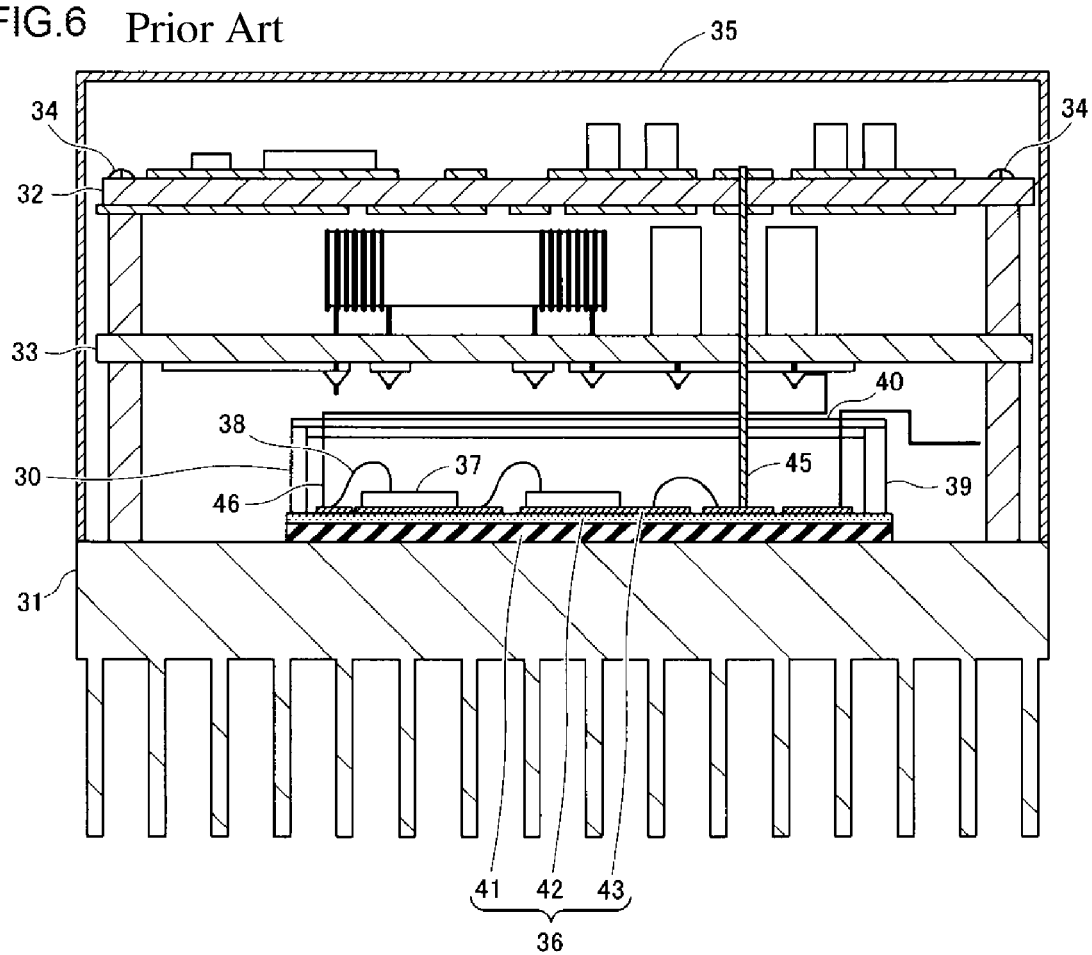

POWER CONVERSION DEVICE

CROSS-REFERENCE TO RELATED APPLICATION

This is a continuation application of PCT/JP2015/054904 filed on Feb. 23, 2015, claiming a priority of Japanese Patent Application No. 2014-071982 filed on Mar. 31, 2014, the disclosure of which is incorporated herein.

TECHNICAL FIELD

The present invention relates to a power conversion device, such as an inverter, a servo controller, or a UPS, using a power semiconductor element.

BACKGROUND ART

A power conversion device formed of a power semiconductor is used in extensive fields ranging from consumer equipment, such as a home air conditioner and a refrigerator, to industrial equipment such as an inverter and a servo controller.

A power semiconductor is mounted on a circuit board, such as a metal base substrate or a ceramics substrate, in terms of power consumption. One or a plurality of circuit elements, such as power semiconductors, is mounted on the circuit board, and a plastic case frame is bonded to the circuit board and is sealed with a silicone gel or an epoxy resin, thereby forming a power semiconductor module.

Meanwhile, in order to reduce manufacturing cost, there is also a full mold power semiconductor module formed by a transfer molding method (for example, refer to PTL 1).

Normally, a power conversion device, in which the heretofore described power semiconductor module is used as a main circuit, is formed of other power circuit and control circuit. The power circuit and control circuit comprises various kinds of parts, such as an IC, an LSI, a resistance, a capacitor, and a reactor, but normally, are mounted on a printed circuit board.

FIG. 6 is a sectional view showing one example of a structure of a heretofore known power conversion device. As shown in FIG. 6, a power semiconductor module 30 is mounted on a heatsink 31 via thermal grease in order to enhance heat releasability. Further, a printed circuit board 32 and a printed circuit board 33, on each of which electronic circuit parts are mounted, are disposed above the power semiconductor module 30, and the printed circuit boards 32 and 33 are joined by pins 34 or the like. Further, as shown in FIG. 6, the portion from the upper side of the printed circuit board 32 to the lateral side of the printed circuit boards 32 and 33 and power semiconductor module 30 is covered with a cover 35.

The power semiconductor module 30 shown in FIG. 6 comprises an insulating substrate 36, power semiconductor elements 37, wires 38, a case body 39, and a lid 40. As shown in FIG. 6, the power semiconductor elements 37 are mounted on the insulating substrate 36. The insulating substrate 36 has, for example, a configuration wherein an insulating layer 42 is formed on the front surface of a metal base 41, and circuit patterns 43 are formed on the front surface of the insulating layer 42. The insulating layer 42 is formed by solidifying, for example, an epoxy resin containing inorganic filler.

As shown in FIG. 6, in the power semiconductor elements 37, the rear surface electrode thereof is joined to the top of the circuit pattern of the insulating substrate 36. Also, in the power semiconductor elements 37, the front surface electrode thereof is electrically connected to the adjacent circuit pattern 43 via the wire 38. Furthermore, connection lead terminals 45 and 46 are joined to the circuit patterns 43 by soldering or the like.

Further, the power semiconductor module 30 and the printed circuit boards 32 and 33 are electrically connected via the connection lead terminals 45 and 46.

CITATION LIST

Patent Literature

PTL 1: JP-A-9-139461

SUMMARY OF INVENTION

Technical Problem

However, the structure of the heretofore known power conversion device shown in FIG. 6 has the problem that the heat generated by the power semiconductor elements 37 cannot be efficiently released to the heatsink 31.

That is, as shown in FIG. 6, the power semiconductor elements 37 is mounted on the insulating substrate 36, many material layers are interposed between the power semiconductor elements 37 and the heatsink 31, and the distance between the power semiconductor elements 37 and the heatsink 31 is also large. Therefore, a certain considerable size of thermal resistance exists between the power semiconductor elements 37 and the heatsink 31, and the cooling characteristics are not always sufficiently produced, thus preventing the heat generated from the power semiconductor elements 37 from being sufficiently released.

Also, as shown in FIG. 6, as the power semiconductor module 30 is one completed product, a certain volume is required to dispose the power semiconductor module 30 in the power conversion device, thus preventing a reduction in size. Furthermore, as shown in FIG. 6, as the printed circuit boards 32 and 33 are mounted above the power semiconductor module 30, it is not possible to realize a reduction in the height of the power conversion device.

Also, there are the problems that the power semiconductor module 30 completed as a product is incorporated in the power conversion device, thus preventing a reduction in cost, and furthermore, the number of parts increases with the structure of the power conversion device of FIG. 6, thus leading to a further increase in cost. Also, the structure of the power conversion device of FIG. 6 also has the problem of a complicated assembly.

The invention, having been made with, in mind, these kinds of problems, has for its object to provide a power conversion device which is superior in heat releasability and can meet the demand for a reduction in the cost and size of the power conversion device.

Solution to Problem

In the invention, it is possible to reduce the thermal resistance between a power semiconductor element and a heatsink compared with the heretofore known power conversion device, and thus, it is possible to reduce the thermal resistance in this way, it is possible to lower the temperature of the power semiconductor element when the power conversion device is in operation, as a result of which it is possible to reduce the chip size of the power semiconductor element, and thus possible to lead to a reduction in cost.

In addition, in the invention, it is possible to effectively promote a reduction in size, height, and cost by fitting a unit including a power semiconductor element into a printed circuit board, rather than using a power semiconductor module completed as a product in the heretofore known way. Specifically, the invention is illustrated as follows.

A power conversion device according to the invention includes a printed circuit board, provided on a heat releasing heatsink, which has a through hole and is furnished with wires; a metal case having a depressed portion to be fitted in the through hole, the depressed portion being mounted on a top of the heatsink via a heat releasable insulating layer made of a ceramics material; and a power semiconductor element, mounted in the depressed portion, which is electrically connected to the wires of the printed circuit board.

According to the invention, the power semiconductor element is mounted in the depressed portion of the metal case which is high in heat capacity and high in heat releasability, and the depressed portion of the metal case is mounted to the top of the heatsink via the heat releasable insulating layer made of a ceramics material superior in heat conductivity. By so doing, it is possible to reduce the thermal resistance below the power semiconductor element, and thus possible to improve heat releasability. Consequently, as the power semiconductor element, it is possible to adopt a power semiconductor element which is lower in cost and smaller in area.

Also, in the invention, as the metal case, on which is mounted the power semiconductor element, by being fitted into the through hole of the printed circuit board on which circuit elements are mounted, is mounted to the heatsink, it is not necessary to house only a main circuit portion of a power semiconductor module in an independent case, as in the heretofore known power conversion device, thus facilitating the electrical connection with the circuit elements mounted on the printed circuit board too. Further, it is possible to effectively reduce the volume of the power conversion device compared with the heretofore known power conversion device.

In the invention, the metal case is used to mount the power semiconductor element. As the metal case only has to be press-cut, it is possible to mold the metal case by drawing, and thus possible to make it easy to manufacture the metal case. Moreover, the metal case, being a box-shape, can be simply fitted into the through hole from the upper surface side of the printed circuit board, and it is possible to simply and appropriately integrate the metal case and printed circuit board by joining the two with an adhesive or by soldering with the metal case being fitted in the through hole.

Also, as the power semiconductor element is mounted in the depressed portion of the metal case, the power semiconductor element is enclosed with the sidewall portion of the metal case, and it is possible to enhance the function of protecting the power semiconductor element. Also, by mounting the power semiconductor element in the depressed portion of the metal case and fitting the metal case into the through hole of the printed circuit board, it is possible to dispose the power semiconductor element within the plate thickness of the printed circuit board. Therefore, it is possible to effectively shorten the distance between the power semiconductor element and the heatsink.

According to the above, in the invention, as the metal case, on which the power semiconductor element is mounted, is mounted to the heatsink via the heat releasable insulating layer made of a ceramics material, it is possible to provide a power conversion device superior in heat releasability compared with the heretofore known power conversion device. Furthermore, in the invention, as the power semiconductor element, it is possible to adopt a power semiconductor element which is lower in cost and smaller in area, and owing to the metal case being fitted into the through hole of the printed circuit board, resulting in a simplified electrical connection structure, or the like, it is possible to realize a reduction in size and height, and it is possible to achieve a reduction in cost.

In the power conversion device, it is preferable that the metal case has the depressed portion enclosed with a bottom portion and a sidewall portion, and a flange portion, provided on the upper end of the sidewall portion, which extends outwardly of the sidewall portion. In the invention, it is possible to cause the flange portion to function as a stopper when the metal case is fitted into the through hole.

Also, in the power conversion device, it is preferable that the flange portion and a metal foil pattern provided on the upper surface of the printed circuit board face each other, and that the flange portion and the metal foil pattern are soldered together. By so doing, it is possible to simply and reliably integrate the metal case and printed circuit board.

Also, in the power conversion device, it is preferable that the heat releasable insulating layer is 1 to 300 W/m·K in heat conductivity and 10 to 500 μm in thickness. By so doing, it is possible to more effectively reduce the thermal resistance below the power semiconductor element, and thus possible to improve heat releasability.

Also, in the power conversion device, it is preferable that the heat releasable insulating layer is formed of one or more kinds of fillers selected from a group of silicon oxide, aluminum oxide, silicon nitride, aluminum nitride, and boron nitride fillers. The fillers are all ceramics materials superior in heat conductivity, and by using a ceramics material selected from the ceramic materials as the heat releasable insulating layer, it is possible to more effectively reduce the thermal resistance below the power semiconductor element, and thus possible to improve heat releasability.

Also, in the power conversion device, it is preferable that the heat releasable insulating layer is formed by depositing one or more kinds of ceramics particles with a plasma spraying method, or that the insulating layer is formed by depositing one or more kinds of ceramics particles with an aerosol deposition method. By so doing, it is possible to more effectively realize an improvement in dielectric breakdown voltage and a reduction in thermal resistance.

Advantageous Effects of Invention

According to the invention, as the metal case, on which the power semiconductor element is mounted, is mounted to the heatsink via the heat releasable insulating layer made of a ceramics material, it is possible to provide a power conversion device superior in heat releasability compared with the heretofore known power conversion device. Furthermore, in the invention, as the power semiconductor element, it is possible to adopt a power semiconductor element which is lower in cost and smaller in area, and owing to the metal case being fitted into the through hole of the printed circuit board, resulting in a simplified electrical connection structure, or the like, it is possible to realize a reduction in size and height, and it is possible to achieve a reduction in cost.

BRIEF DESCRIPTION OF DRAWINGS

FIG. 6 is a sectional view showing one example of a structure of a heretofore known power conversion device.

DESCRIPTION OF EMBODIMENTS

Figure 1:
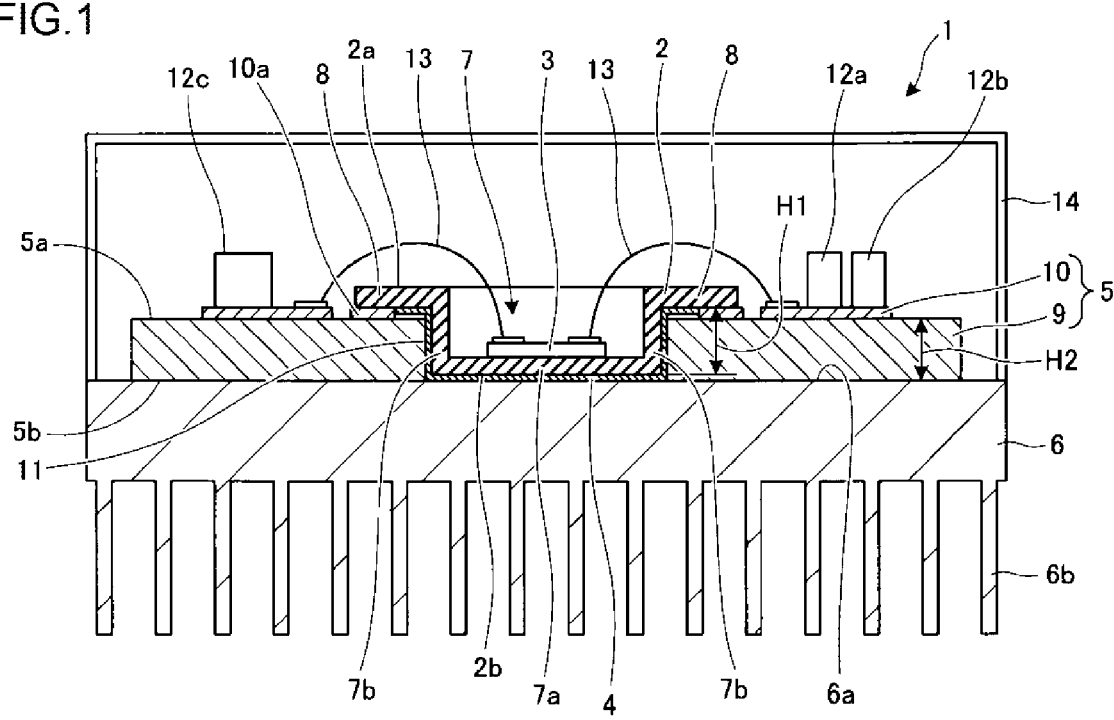
FIG. 1 is a sectional view showing a structure of a power conversion device according to a first embodiment.

Hereafter, a detailed description will be given, referring to the accompanying drawings, of embodiments of the invention. FIG. 1 is a sectional view showing a structure of a power conversion device according to a first embodiment.

As shown in FIG. 1, a power conversion device 1 according to the first embodiment includes a printed circuit board 5, provided on a heat releasing heatsink 6, which has a through hole 11 and is furnished with wires, a metal case 2 having a depressed portion 7 fitted in the through hole 11, the depressed portion 7 being mounted on the top of the heatsink 6 via a heat releasable insulating layer 4 made of a ceramics material, and a power semiconductor element 3 mounted in the depressed portion 7 and electrically connected to the wires of the printed circuit board 5. Hereafter, a detailed description will be given of the individual members.

As shown in FIG. 1, the metal case 2, having an upper surface 2a and a lower surface 2b, has a configuration wherein the downwardly depressed portion 7 is provided in the upper surface 2a. The depressed portion 7 is a bottomed space formed of a bottom portion 7a and a sidewall portion 7b enclosing the bottom portion 7a. Also, the metal case 2 is provided with a flange portion 8 extending outwardly of the sidewall portion 7b of the depressed portion 7 from the upper end of the sidewall portion 7b. The flange portion 8 may be formed all around the sidewall portion 7b, or may be formed in only one portion.

The metal case 2 shown in FIG. 1 has a substantially constant plate thickness from the bottom portion 7a through the sidewall portion 7b to the flange portion 8. The plate thickness is, for example, on the order of 0.5 to 2.0 mm, but is not particularly limited thereto. Also, the metal case 2 can be formed of a copper plate, a copper alloy plate, an aluminum plate, an aluminum alloy plate, or the like.

In the first embodiment, the metal case 2 having the downwardly depressed portion 7 in the central portion can be molded by pressing. The plan view shape (the shape viewed from directly above) of the depressed portion 7 is a square, a rectangle, a circle, or the like, and is not particularly limited thereto. Herein, an example which adopts the square depressed portion 7 is shown.

In this way, the metal case 2, by being formed of a metal material with good electrical and heat conductivity and being reduced in thickness to 0.5 to 2.0 mm, can be formed so as to be high in heat capacity and superior in heat releasability.

As shown in FIG. 1, the power semiconductor element 3, such as an IGBT (Insulated Gate Bipolar Transistor), a MOSFET (Metal-Oxide-Semiconductor Field-Effect Transistor), or a power transistor, is mounted on the upper surface of the bottom portion 7a of the metal case 2. For example, the power semiconductor element 3 can be joined to the metal case 2 by soldering. Also, the number of power semiconductor elements 3 mounted may be two or more.

As shown in FIG. 1, the heat releasable insulating layer 4 is formed directly on the lower surface 2b of the metal case 2. The heat releasable insulating layer 4 is continuously (integrally) formed from the lower surface (rear surface) of the bottom portion 7a of the depressed portion 7 through the outer side surface of the sidewall portion 7b to one portion of the lower surface (rear surface) of the flange portion 8, as shown in FIG. 1.

The heat releasable insulating layer 4 is formed of a ceramics material superior in heat conductivity. That is, by forming the heat releasable insulating layer 4 of a ceramics material, it is possible to effectively improve heat releasability compared with, for example, an insulating layer into which an inorganic filler is solidified with a resin.

The heat releasable insulating layer 4 may be formed all over the lower surface (rear surface) 2b of the metal case 2. Also, the heat releasable insulating layer 4 may be formed at least only on the lower surface (rear surface) of the bottom portion 7a of the depressed portion 7 of the metal case 2.

It is preferable that the thickness of the heat releasable insulating layer 4 is on the order of 10 to 500 μm. By so doing, it is possible to improve the dielectric breakdown voltage of the heat releasable insulating layer 4, and it is possible to keep thermal resistance low.

It is preferable that the heat conductivity of the heat releasable insulating layer 4 is 1 to 300 W/m·k and that the thickness of the heat releasable insulating layer 4 is 10 to 500 μm. By so doing, it is possible to effectively reduce the thermal resistance below the power semiconductor element 3 in the power conversion device 1 of FIG. 1.

Also, it is preferable that the heat releasable insulating layer 4 is formed of one or more kinds of fillers selected from a group of silicon oxide, aluminum oxide, silicon nitride, aluminum nitride, and boron nitride fillers. All the fillers are ceramics materials superior in heat conductivity. Consequently, by one or more kinds of ceramics materials selected from the group of fillers being used as the heat releasable insulating layer 4, it is possible to more effectively reduce the thermal resistance below the power semiconductor element 3.

The printed circuit board 5 has a configuration wherein circuit patterns 10 made of, for example, copper foil are formed on a substrate body 9 with electrical insulation configured of, for example, glass epoxy (an epoxy resin fortified with a glass fiber).

As shown in FIG. 1, the through hole 11 passing through from an upper surface 5a to a lower surface 5b is formed in the printed circuit board 5. The size and shape of the through hole 11 are determined in accordance with the outer shape of the sidewall portion 7b of the metal case 2.

As shown in FIG. 1, the metal case 2 is fitted in the through hole 11 provided in the printed circuit board 5.

In FIG. 1, a height H1 of the metal case 2 from the lower surface of the bottom portion 7a to the lower surface of the flange portion 8 substantially matches with a thickness H2 of the printed circuit board 5. Therefore, by inserting the depressed portion 7 of the metal case 2 into the through hole 11, it is possible to make the lower surface of the bottom portion 7a of the metal case 2 (actually, as the heat releasable insulating layer 4 exists, the lower surface of the heat releasable insulating layer 4) substantially flush with the lower surface of the printed circuit board 5. Also, the metal case 2 is provided with the flange portion 8, as shown in FIG. 1, but it is possible to cause the flange portion 8 to function as a stopper when the metal case 2 is inserted in the through hole 11 of the printed circuit board 5. That is, when the flange portion 8 abutments against the upper surface of the printed circuit board 5, it can be determined that the insertion of the metal case 2 into the through hole 11 stops, meaning that it is possible to appropriately fit the metal case 2 into the through hole 11 of the printed circuit board 5.

As shown in FIG. 1, a copper foil pattern 10a is provided in a portion, on the upper surface 5a of the printed circuit board 5, which is opposite to the flange portion 8. Consequently, it is possible to bring the flange portion 8 to abutment against the copper foil pattern 10a by fitting the metal case 2 into the through hole 11 of the printed circuit board 5. Further, it is possible to simply and appropriately integrate the metal case 2 and printed circuit board 5 by soldering the flange portion 8 and copper foil pattern 10a. In the first embodiment, a copper foil pattern is used as a metal foil pattern, but a metal foil pattern made of other than copper foil may be used.

Also, the copper foil pattern 10a does not have to be formed on the upper surface 5a of the printed circuit board 5, which is opposite to the flange portion 8. In such a case, the flange portion 8 and the printed circuit board 5 can be joined with an adhesive or the like. Also, the bottom portion 7a of the depressed portion 7 of the metal case 2 and the printed circuit board 5 can also be joined with an adhesive or the like. However, it is possible to simply and reliably integrate the metal case 2 and printed circuit board 5 by soldering the metal case 2 and copper foil pattern 10a, as heretofore described.

As shown in FIG. 1, a plurality of circuit elements 12a, 12b, and 12c is mounted on the circuit patterns 10 of the printed circuit board 5. The circuit elements 12a, 12b, and 12c are various kinds of parts such as an IC, an LSI, a resistance, a capacitor, and a reactor.

The power semiconductor element 3 shown in FIG. 1 forms a main circuit, and the circuit elements 12a, 12b, and 12c forma power circuit and a control circuit.

Further, as the power semiconductor element 3 and the circuit patterns 10 of the printed circuit board 5 form a circuit, as shown in FIG. 1, the power semiconductor element 3 and the circuit patterns 10 are connected by aluminum wires 13, and by so doing, it is possible to electrically connect the power semiconductor element 3 and individual circuit elements 12a, 12b, and 12c. The aluminum wires 13 may be lead frames or the like.

As shown in FIG. 1, the metal case 2 and the printed circuit board 5 are mounted directly to an upper surface 6a of the heatsink 6. "Mounted directly" means that no member other than a joining member such as an adhesive is interposed.

The heatsink 6 is formed of, for example, copper, a copper alloy, aluminum, or an aluminum alloy, but the material is not particularly limited thereto.

As shown in FIG. 1, in the heatsink 6, the upper surface 6a thereof is formed as substantially a plane, and a plurality of projection-shaped cooling fins 6b is formed on the lower surface side (rear surface side).

According to the configuration shown in FIG. 1, it comes to a condition such that the lower surface of the bottom portion 7a of the depressed portion 7 of the metal case 2, on which the power semiconductor element 3 is mounted, is in abutment with the upper surface 6a of the heatsink 6 via the heat releasable insulating layer 4. "Abutment" refers to a direct contact, but a condition in which thermal grease (a joining member) is interposed between the heat releasable insulating layer 4 and the heatsink 6 is also included in the "abutment". That is, the configuration wherein the thermal grease, the heat releasable insulating layer 4, and the metal case 2 are stacked in the order named from the upper surface 6a of the heatsink 6, is included in which the metal case 2 is in abutment with the heatsink 6 via the heat releasable insulating layer 4.

By the heat releasable insulating layer 4 being interposed between the metal case 2 and the heatsink 6, it is possible to secure the electrical insulation between the metal case 2 and the heatsink 6.

As shown in FIG. 1, a cover 14 is mounted to the power conversion device 1 on the upper surface 6a side of the heatsink 6. By so doing, a condition is attained in which the upper side of the power semiconductor element 3 and the upper and lateral sides of the printed circuit board 5 are covered with the cover 14.

As shown in FIG. 1, the power semiconductor element 3 is mounted on the upper surface of the bottom portion 7a of the depressed portion 7 of the metal case 2 which is high in heat capacity and high in heat releasability, and the lower surface (rear surface) of the metal case 2 is covered with the heat releasable insulating layer 4 made of a ceramics material superior in heat conductivity. Further, the metal case 2 and the printed circuit board 5 are mounted directly to the heatsink 6. By so doing, the bottom portion 7a of the metal case 2, which is high in heat conductivity and small in plate thickness, and the heat releasable insulating layer 4, which is likewise high in heat conductivity and small in film thickness, are only interposed, stacked, between the power semiconductor element 3 and the heatsink 6, and it is possible to reduce the thermal resistance below the power semiconductor element 3, and thus possible to improve heat releasability. Consequently, as the power semiconductor element 3, it is possible to adopt a power semiconductor element which is lower in cost and smaller in area.

Also, as shown in FIG. 1, as the configuration is such that the metal case 2 on which the power semiconductor element 3 is mounted, by being fitted into the through hole 11 of the printed circuit board 5 on which the circuit elements 12a, 12b, and 12c are mounted, is mounted to the heatsink 6, it is not necessary to house only a main circuit portion, which is formed of the power semiconductor element 3, in an independent case, as in a heretofore known power semiconductor module, and it is possible to directly connect the power semiconductor element 3 and the circuit patterns 10 of the printed circuit board 5 with the aluminum wires 13 or the like, because of which it is possible to effectively reduce the volume of the power conversion device 1 compared with a heretofore known power conversion device.

In the first embodiment, the metal case 2 is used as a part for mounting the power semiconductor element 3. As the metal case 2 only has to be press-cut, it is possible to mold the metal case 2 by drawing, and thus possible to make it easy to manufacture the metal case 2. Moreover, the metal case 2, which is a box-shape, can be simply fitted into the through hole 11 from the upper surface side of the printed circuit board 5, and it is possible to simply and appropriately integrate the metal case 2 and printed circuit board 5 by joining the two with an adhesive or by soldering with the metal case 2 being fitted in the through hole 11.

Also, as the power semiconductor element 3 is mounted on the upper surface of the bottom portion 7a of the depressed portion 7 of the metal case 2, a condition is such that the power semiconductor element 3 is enclosed with the sidewall portion 7b of the metal case 2, and it is possible to enhance the function of protecting the power semiconductor element 3. Also, as the power semiconductor element 3 is mounted on the upper surface of the bottom portion 7a of the depressed portion 7 of the metal case 2, the power semiconductor element 3 can also be disposed within the plate thickness of the printed circuit board 5 by fitting the metal case 2 into the through hole 11 of the printed circuit board 5.

According to the above, in the first embodiment, as the lower surface (the lower surface of the bottom portion 7a) of the depressed portion 7 of the metal case 2, on which the power semiconductor element 3 is mounted, is mounted to the heatsink 6 via the heat releasable insulating layer 4 made of a ceramics material, it is possible to provide a power conversion device 1 superior in heat releasability compared with the heretofore known power conversion device. Furthermore, as the power semiconductor element 3, it is possible to adopt a power semiconductor element 3 which is lower in cost and smaller in area, and owing to the metal case 2 being fitted into the through hole 11 of the printed circuit board 5, resulting in a simplified electrical connection structure, or the like, it is possible to realize a reduction in size and height, and it is possible to achieve a reduction in cost.

FIGS. 2A-2E are sectional views showing a method of manufacturing the power conversion device according to the first embodiment. Firstly, a description will be given of a method of fabricating a sprayed metal case. A description will be given with the same signs as in FIG. 1 for the same members as in FIG. 1.

Figure 2A:
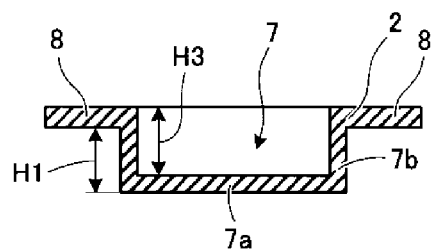
FIGS. 2A-2E are sectional views showing a method of manufacturing the power conversion device according to the first embodiment.

In the step of FIG. 2A, the metal case 2 whose central portion is molded in a downwardly depressed shape is formed by pressing a copper plate of on the order of 0.5 to 2.0 mm. The shape of the depressed portion 7 is made square, rectangular, or circular as viewed from above. Herein, an example which adopts the square depressed portion 7 is shown.

As shown in FIG. 2A, the bottom portion 7a of the depressed portion 7 of the metal case 2 has a flat upper surface, and the upper surface of the bottom portion 7a is a surface on which the power semiconductor element 3 is mounted. Therefore, the upper surface of the bottom portion 7a is formed to a size which allows the power semiconductor element 3 to be appropriately and easily mounted in. Also, as shown in FIG. 2A, the flange portion 8 extending outwardly of the sidewall portion 7b of the depressed portion 7 from the upper end of the sidewall portion 7b is formed. It is not essential to form the flange portion 8, but in the manufacturing process, it is easy to carry the metal case 2 by holding a portion of the flange portion 8, and it is possible, when inserting the metal case 2 into the through hole 11 of the printed circuit board 5 in the subsequent step, to smoothly insert the metal case 2 into the through hole 11 while holding the metal case 2 with the flange portion 8. Therefore, it is preferable to form the flange portion 8 on the metal case 2.

Also, by defining a depth H3 of the depressed portion 7 (≈the height H1 from the lower surface of the bottom portion 7a to the lower surface of the flange portion 8) in accordance with the thickness of the printed circuit board 5, it is possible to make the lower surface of the bottom portion 7a of the metal case 2 substantially flush with the lower surface of the printed circuit board 5 when the flange portion 8 abuts against the upper surface of the printed circuit board 5 when the metal case 2 is inserted into the through hole 11 of the printed circuit board 5.

Figure 2B:
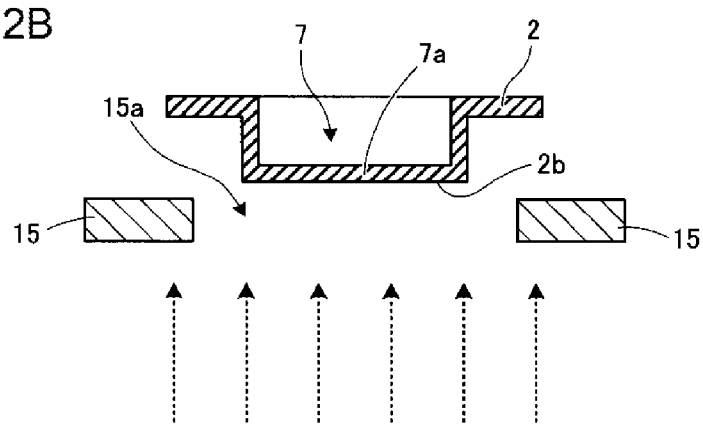

Next, in the step of FIG. 2B, a mask 15 is prepared. An opening portion 15a is provided in the center of the mask 15, and a condition is such that the opening portion 15a and the lower surface 2b of the metal case 2 face each other. As the opening portion 15a is wider, it is possible to form the wider region of the lower surface 2b of the metal case 2 for the heat releasable insulating layer 4. At least the opening portion 15a is formed to a size which allows the opening portion 15a to face the whole of the lower surface of the bottom portion 7a of the depressed portion 7 of the metal case 2.

As shown in FIG. 2B, in a condition in which the mask 15 is opposed to the lower surface 2b side of the metal case 2, ceramics powder is layered by a spraying method or an aerosol deposition method, thus forming the heat releasable insulating layer 4. The direction of the arrows in FIG. 2B indicates a spraying direction, but by the spraying direction being changed in turn without being fixed to one direction, as will be described hereafter, it is possible to accurately and simply form the heat releasable insulating layer 4 on the individual surfaces, different in inclination, of the three-dimensional lower surface 2b of the metal case 2.

When forming the heat releasable insulating layer 4 on the lower surface 2b of the metal case 2 using, for example a plasma spraying method in the spraying methods, one or more kinds, of silicon oxide, aluminum oxide, silicon nitride, aluminum nitride, and boron nitride, are used for ceramics powder. Under atmospheric pressure or reduced pressure, spraying is carried out on the metal case 2 via the mask 15, and the heat releasable insulating layer 4 is deposited on the lower surface 2b of the metal case 2, thus forming an insulating metal case 16 (refer to FIG. 2C).

As no ceramics powder can be layered on a surface parallel to the spraying direction, spraying is carried out laterally on the metal case 2 in order to form the heat releasable insulating layer 4 on the outer side surface of the sidewall portion 7b of the depressed portion 7. The thickness of the heat releasable insulating layer 4 can be adjusted by controlling a spray time. It is preferable that the thickness of the heat releasable insulating layer 4 is on the order of 50 to 500 μm. For example, when the thickness of the heat releasable insulating layer 4 is 500 μm, the heat releasable insulating layer 4 has an alternating current breakdown voltage of 10 kV or more, and can also be used for a power element with a breakdown voltage rating of 1200 V.

Figure 2C:
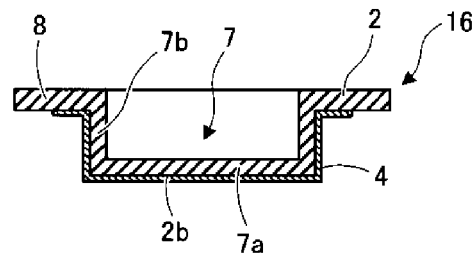
Figure 2D:
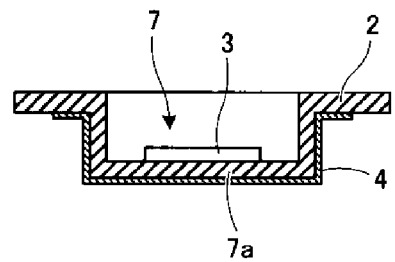
Figure 2E:
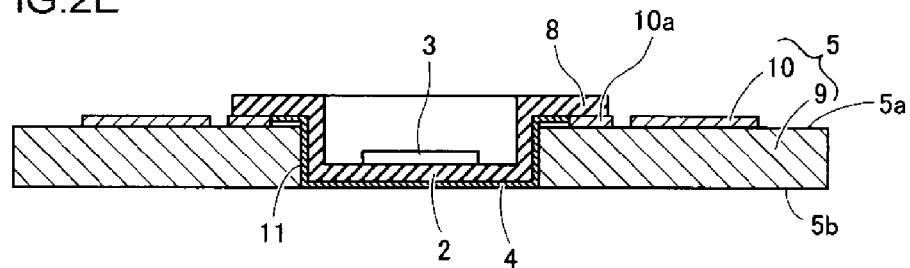
Figure 3A:
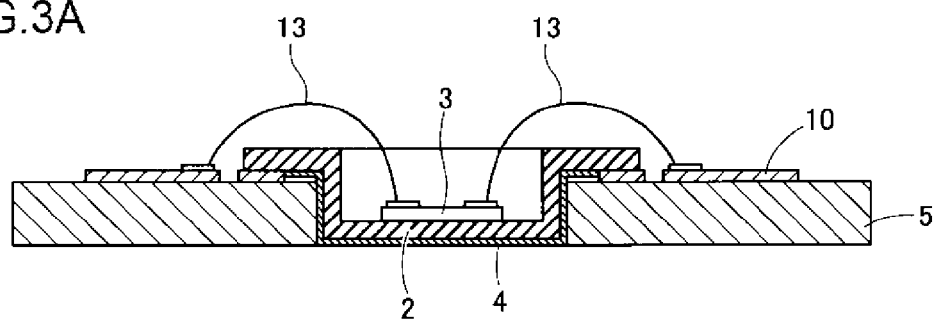
FIGS. 3A-3C are sectional views showing a method of manufacturing the power conversion device according to the first embodiment, which are carried out subsequent to FIGS. 2A-2E.
Figure 3B:
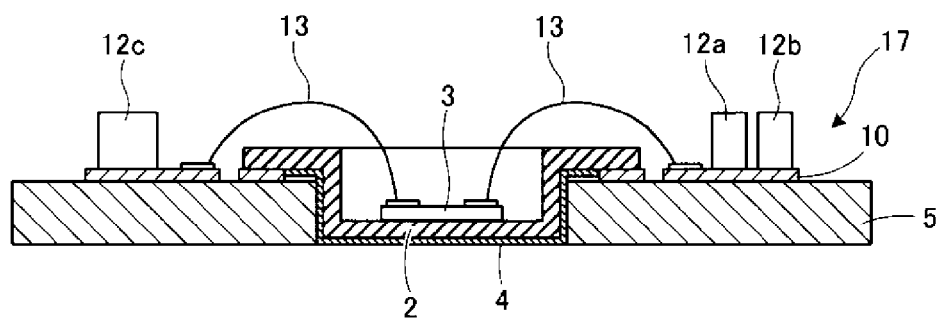
Figure 3C:
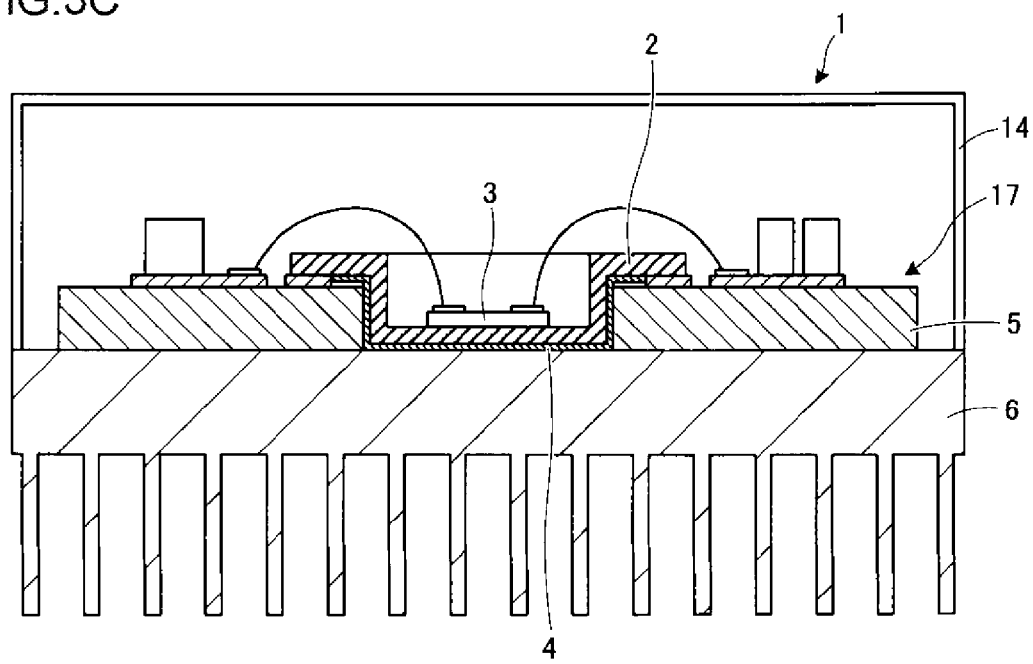

As shown in FIG. 2C, in the first embodiment, the heat releasable insulating layer 4 can be formed continuously from the lower surface of the bottom portion 7a of the depressed portion 7 of the metal case 2 through the outer side surface of the sidewall portion 7b to one portion of the lower surface of the flange portion 8.

Next, a description will be given of a case in which to deposit the heat releasable insulating layer 4 on the lower surface 2b of the metal case 2, an aerosol deposition method is used. The aerosol deposition method is a technology whereby a fine or ultrafine particle raw material is aerosolized by being mixed with a gas, thus forming a film on a substrate through nozzles. As the gas, helium or air is used. The device includes an aerosolization chamber and a film formation chamber. The film formation chamber is depressurized to around 50 to 1 kPa by a vacuum pump. A fine or ultrafine particle material which is the raw material is aerosolized by being agitated and mixed with a gas, in a dried state, in the aerosolization chamber, is conveyed to the film formation chamber by a gas flow generated by the difference in pressure between the two chambers, and by passing through the slit type nozzles, is accelerated and sprayed on the lower surface 2b of the metal case 2. As the raw material fine particles, ceramics powder which is mechanically pulverized to a particle diameter of 0.1 to 2 μm is used. The gas conveyed ultrafine particles are accelerated to several hundred m/sec by being passed through the nozzles of minute openings in the depressurized chamber. As the speed of film formation and the density of a formed film body depend greatly upon the particle diameter, aggregation condition, dry condition, or the like, of ceramics fine particles to be used, an agglomerate particle disintegrator or classifier is used between the aerosolization chamber and the film formation chamber.

Further, in order to form the heat releasable insulating layer 4 as a film, particulate ceramics of a particle diameter of 0.1 to 2 μm are sprayed on the substrate at high speed, and are fractured into fine crystal particles of around 10 to 30 nm by the collision energy generated at this time, and newly formed surfaces are formed, thus activating the surfaces of the particles, leading to the combination of the particles with each other, thereby forming a ceramics film of dense nanocrystal structure. Also, it is possible to form the film at room temperature without particularly raising the temperature.

As fine particles for aerosol deposition, it is preferable to use anyone of aluminum oxide, silicon nitride, aluminum nitride, and boron nitride, whose particle diameter is on the order of 0.1 to 2 μm. In order to obtain a necessary film thickness, the fine particles are sprayed using the mask 15 for a predetermined time, thus forming the heat releasable insulating layer 4 shown in FIG. 2C.

In the case of the aerosol deposition method too, by adjusting the direction of the nozzles in accordance with the heretofore described spraying method, it is possible to form the heat releasable insulating layer 4 continuously from the lower surface of the bottom portion 7*a* of the depressed portion 7 of the metal case 2 through the outer side surface of the sidewall portion 7*b* to one portion of the lower surface of the flange portion 8, as in FIG. 2C.

Herein, as the fine particles, it is also possible to apply fine particles wherein a film of aluminum oxide is formed on any one of silicon oxide, silicon nitride, aluminum nitride, and boron nitride fillers, or fine particles wherein a film of silicon oxide is formed on any one of silicon nitride, aluminum nitride, and boron nitride fillers. By using these fine particles, it is possible to form a heat releasable insulating layer 4 into which two or more kinds of ceramics materials are combined.

It is preferable that the thickness of the heat releasable insulating layer 4 is on the order of 50 to 500 μm in the same way as in the spraying method. For example, when the thickness of the heat releasable insulating layer 4 is 500 μm, the heat releasable insulating layer 4 has an alternating current breakdown voltage of 10 kV or more, and can also be used for a power element with a breakdown voltage rating of 1200 V.

Next, in the step of FIG. 2D, the power semiconductor element 3 is joined to the upper surface of the bottom portion 7*a* of the depressed portion 7 of the metal case 2 by soldering. Soldering is carried out in a furnace, which is capable of hydrogen reduction, utilizing pelletized solder. The reason for using a furnace capable of hydrogen reduction is that an oxide film on a surface of the metal case 2 is removed by hydrogen reduction, and the surface is activated, thereby improving the wettability with the solder. As a solder material, for example, high-temperature solder of Sn, Pb, and Ag, or lead-free solder of a Sn—Ag—Cu family, is used. The temperature when soldering is set in response to the melting point of the solder.

When a void remains in the solder layer between the power semiconductor element 3 and the metal case 2, the thermal resistance increases, and it is not possible to efficiently release the heat generated from the power semiconductor element 3. Therefore, in order not to generate a void, a vacuuming of 10 Torr (1.3 kPa) or less is carried out in a condition in which the solder is melting.

Next, the printed circuit board 5 in which the through hole 11 is formed from the upper surface 5*a* to the lower surface 5*b* is prepared. The printed circuit board 5 has a configuration wherein the circuit patterns 10 made of, for example, copper foil are formed on the substrate body 9 with electrical insulation. The through hole 11 is formed to a size which allows the metal case 2 to be inserted in. That is, the outer shape of the sidewall portion 7*b* of the depressed portion 7 of the metal case 2 substantially matches with the inner shape of the through hole 11.

Further, in the step of FIG. 2E, the metal case 2 is fitted in from the upper surface 5*a* side of the printed circuit board 5. At this time, the metal case 2 and the printed circuit board 5 are fixed with an adhesive, or the like, so that the two are integrated (for example, so that the metal case 2 does not fall off the printed circuit board 5 even when turned upside down).

Also, as shown in FIG. 2E, the flange portion 8 of the metal case 2 is opposite to the copper foil pattern 10*a* provided on the upper surface 5*a* of the printed circuit board 5, and it is possible to abut the flange portion 8 against the copper foil pattern 10*a* by fitting the metal case 2 into the through hole 11 of the printed circuit board 5. Further, by soldering between the flange portion 8 and the copper foil pattern 10*a*, it is possible to appropriately and simply integrate the metal case 2 and printed circuit board 5.

FIGS. 3A-3C are sectional views showing a method of manufacturing the power conversion device according to the first embodiment, which is carried out subsequent to FIGS. 2A-2E.

In the step of FIG. 3A, the power semiconductor element 3 and the circuit patterns 10 of the printed circuit board 5 are connected by the aluminum wires 13. By so doing, it is possible to form a circuit between the power semiconductor element 3 and the circuit patterns 10 of the printed circuit board 5. The aluminum wires 13 are 125 to 500 μm diameter Al wires, and the joining is carried out by ultrasonic joining. Lead frames or ribbons of aluminum may be used to join the power semiconductor element 3 and the circuit patterns 10 of the printed circuit board 5.

Next, in the step of FIG. 3B, the various circuit elements 12*a*, 12*b*, and 12*c* are mounted on the circuit patterns 10 of the printed circuit board 5. Normally, the mounting of the circuit elements 12*a*, 12*b*, and 12*c* is carried out using cream solder in a reflow furnace. By so doing, the metal case 2 and the printed circuit board 5 are integrated, and a power conversion element 17 wherein the power semiconductor element 3 and the circuit elements 12*a*, 12*b*, and 12*c* are electrically connected, is completed.

Finally, the power conversion element 17 obtained in FIG. 3B is mounted to the heatsink 6 via thermal grease. Further, by covering the cover 14, the power conversion device 1 is completed (refer to FIG. 3C).

As heretofore described, the heat releasable insulating layer 4 to be formed on the lower surface (rear surface) 2*b* of the metal case 2 is formed by the aerosol deposition method or plasma spraying method. By so doing, there are the following advantages.

Firstly, it is possible to improve dielectric breakdown voltage. With the aerosol deposition method, as a film can be formed at a room temperature, and sub-micron order ceramics fine particles are hit against the substrate at sonic level speed, the ceramics fine particles whose active newly formed surfaces are exposed are combined. Also, the same applies to the plasma spraying method. In either way, it is possible to form a ceramics fine particle layer which is a very dense electrical insulating film, and as no void is included in the film, it is possible to improve a breakdown voltage per unit length on the order of 10 times greater than that of a ceramics plate formed by a heretofore known sintering method.

Secondly, it is possible to reduce thermal resistance. Heat conductivity is equivalent to bulk, and as the heat conductivity, it is possible to secure, for example, on the order of approximately 20 W/m·k with aluminum oxide ($Al_2O_3$), on the order of approximately 160 to 180 W/m·k with aluminum nitride (AlN), and on the order of approximately 80 W/m·k with silicon nitride ($Si_3N_4$). In addition to this, as a breakdown voltage per unit length improves, it is possible to form the heat releasable insulating layer 4 to a thin thickness, and because of this, it is possible to reduce the thermal resistance of the whole.

According to the above, it is possible to secure both high insulation and low heat resistance by forming the heat releasable insulating layer 4, which is to be formed on the lower surface 2b of the metal case 2, using the aerosol deposition method or plasma spraying method.

In this way, in the power conversion device 1 of the first embodiment, as the lower surface of the metal case 2, on which the power semiconductor element 3 is mounted, is mounted directly to the heatsink 6 via the heat releasable insulating layer 4 made of a ceramics material superior in heat conductivity, it is possible to sufficiently reduce the thermal resistance below the power semiconductor element 3, and thus possible to obtain superior heat releasability. In addition, in the first embodiment, by mounting the power semiconductor element 3 in the depressed portion 7 using the metal case 2, it is possible to effectively shorten the distance between the power semiconductor element 3 and the heatsink 6, and thus possible to effectively release the heat generated from the power semiconductor element 3 to the heatsink 6.

Figure 4:
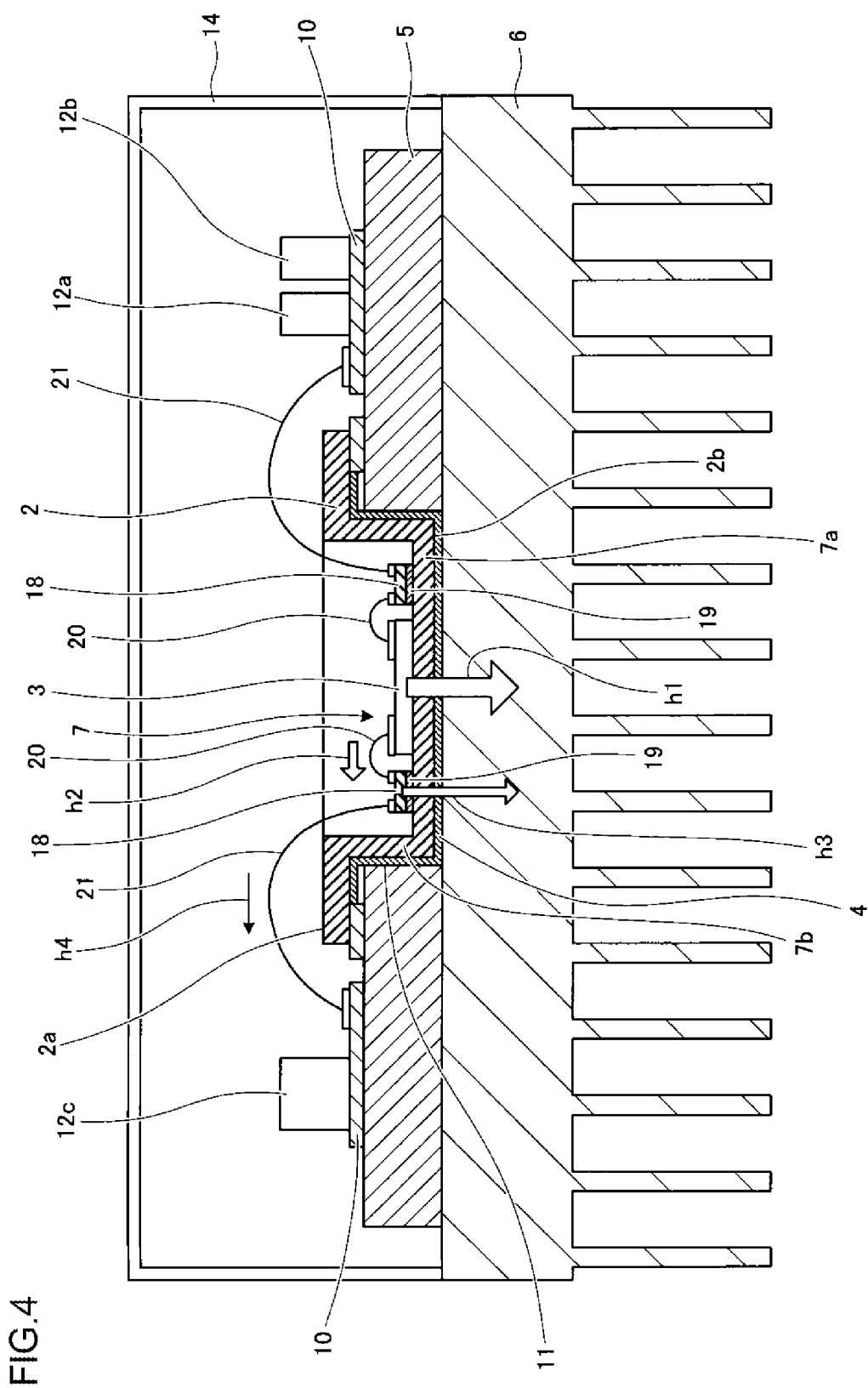
FIG. 4 is a sectional view showing a structure of a power conversion device according to a second embodiment.

FIG. 4 is a sectional view showing a structure of a power conversion device according to a second embodiment. In FIG. 4, a description will be given with the same signs in FIG. 1 for the same members in FIG. 1.

In the embodiment shown in FIG. 4, the power semiconductor element 3 and relay electrodes 18 are provided on the upper surface of the bottom portion 7a of the depressed portion 7 of the metal case 2. As shown in FIG. 4, the relay electrodes 18 are disposed on the upper surface of the bottom portion 7a via relay electrode insulating layers 19. It is preferable that the relay electrode insulating layers 19 are formed of a ceramics material superior in heat conductivity, in the same way as the heat releasable insulating layer 4. That is, the relay electrode insulating layers 19 are preferably 1 to 300 W/m·k in heat conductivity and 10 to 500 μm in thickness, and are preferably formed of one or more kinds of fillers selected from a group of silicon oxide, aluminum oxide, silicon nitride, aluminum nitride, and boron nitride fillers.

As shown in FIG. 4, the power semiconductor element 3 and the relay electrodes 18 are connected by bonding wires 20, and the relay electrodes 18 and the circuit patterns 10 of the printed circuit board 5 are connected by bonding wires 21. Alternatively, the bonding wires 20 and 21 may be lead frames.

In the embodiment of FIG. 4 too, the metal case 2 is fitted in the through hole 11 formed in the printed circuit board 5, and the metal case 2, by being fitted in the through hole 11 of the printed circuit board 5, is mounted directly to the upper surface of the heatsink 6.

Also, as shown in FIG. 4, the heat releasable insulating layer 4 of a ceramics material is formed directly on the lower surface 2b of the metal case 2.

Therefore, it comes to a condition such that the lower surface of the depressed portion 7 (the lower surface of the bottom portion 7a) of the metal case 2, on which the power semiconductor element 3 is mounted, abuts against the upper surface of the heatsink 6 via the heat releasable insulating layer 4 superior in heat conductivity. According to the above, in the embodiment of FIG. 4, it is possible to sufficiently reduce the thermal resistance below the power semiconductor element 3, and thus possible to achieve a configuration having superior heat releasability. Consequently, as the power semiconductor element 3, it is possible to adopt a power semiconductor element which is lower in cost and smaller in area.

Also, as shown in FIG. 4, as the metal case 2 on which the power semiconductor element 3 is mounted, by being fitting into the through hole 11 of the printed circuit board 5 on which the circuit elements 12a, 12b, and 12c are mounted, is mounted directly to the heatsink 6, it is not necessary to house only a main circuit portion, which is formed of the power semiconductor element 3, in an independent case, as in the heretofore known power semiconductor module, and it is possible to connect the power semiconductor element 3 and the circuit patterns 10 of the printed circuit board 5 with the bonding wires 20 and 21, because of which it is possible to effectively reduce the volume of the power conversion device 1 compared with the heretofore known power conversion device.

In the second embodiment, the metal case 2 is used to mount the power semiconductor element 3. As the metal case 2 only has to be press-cut, it is possible to mold the metal case 2 by drawing, and thus possible to make it easy to manufacture the metal case 2. Moreover, the metal case 2, being a box-shape, can be simply fitted into the through hole 11 from the upper surface side of the printed circuit board 5, and it is possible to simply and appropriately integrate the metal case 2 and printed circuit board 5 by joining the two with an adhesive or by soldering with the metal case 2 fitted in the through hole 11.

Also, as the power semiconductor element 3 is mounted on the upper surface of the bottom portion 7a of the depressed portion 7 of the metal case 2, it comes to a condition such that the power semiconductor element 3 is enclosed with the sidewall portion 7b of the metal case 2, so that it is possible to enhance the function of protecting the power semiconductor element 3. Also, by mounting the power semiconductor element 3 on the upper surface of the bottom portion 7a of the depressed portion 7 of the metal case 2, it is also possible to dispose the power semiconductor element 3 within the plate thickness of the printed circuit board 5 in a condition in which the metal case 2 is fitted in the through hole 11 of the printed circuit board 5, and it is possible to shorten the distance between the power semiconductor element 3 and the heatsink 6, and thus possible to more effectively enhance heat releasability.

According to the above, in the second embodiment, as the metal case 2, on which the power semiconductor element 3 is mounted, is mounted to the heatsink 6 via the heat releasable insulating layer 4 made of a ceramics material, it is possible to provide a power conversion device 1 superior in heat releasability compared with the heretofore known power conversion device. Furthermore, as the power semiconductor element 3, it is possible to adopt a power semiconductor element 3 which is lower in cost and smaller in area, and owing to the metal case 2 being fitted into the through hole 11 of the printed circuit board 5, resulting in a simplified structure of electrical connection between the two, or the like, it is possible to realize a reduction in size and height, and it is possible to achieve a reduction in cost.

In addition, in the second embodiment, by providing the relay electrodes 18, it is possible to more effectively enhance heat releasability, and it is possible to particularly suppress the amount of heat transferred to the printed circuit board 5 side.

The arrows shown in FIG. 4 indicate the flows of heat when generated when the power semiconductor element 3 is in operation. The width of the outlined arrows qualitatively denotes the size of the amount of heat flowing. FIG. 4 shows only the flow of heat flowing along the bonding wires on the left side of the power semiconductor element 3.

As shown in FIG. 4, the heat generated when the power semiconductor element 3 is in operation is transferred to the heatsink 6, via a solder layer (not shown), the bottom portion 7a of the metal case 2, and the heat releasable insulating layer 4, from the power semiconductor element 3 (arrow h1).

At this time, one portion of the heat is transferred to the relay electrodes 18 by way of the bonding wires 20 (arrow h2). The heat transferred to the relay electrodes 18 is transferred to the heatsink 6 via the relay electrode insulating layers 19, made of a ceramics material superior in heat conductivity, which are below the relay electrodes 18, the bottom portion 7a of the metal case 2, and the heat releasable insulating layer 4 (arrow h3).

Consequently, it is possible to sufficiently reduce the amount of heat transferred to the printed circuit board 5 side by way of the bonding wires 21 from the relay electrodes 18 (an arrow h4).

Also, with the configuration shown in FIG. 4, as there are two heat transfer paths to release the heat, generated by the power semiconductor element 3, to the heatsink 6, i.e. the arrow h1 path to transfer heat from the power semiconductor element 3 via the bottom portion 7a of the metal case 2 and the heat releasable insulating layer 4, and the arrow h3 path to transfer heat from the relay electrodes 18 via the bottom portion 7a of the metal case 2 and the heat releasable insulating layer 4, it is possible to efficiently release heat to the heatsink 6 compared with in the first embodiment shown in FIG. 1, and thus possible to obtain a power conversion device superior in hear releasability.

Figure 5:
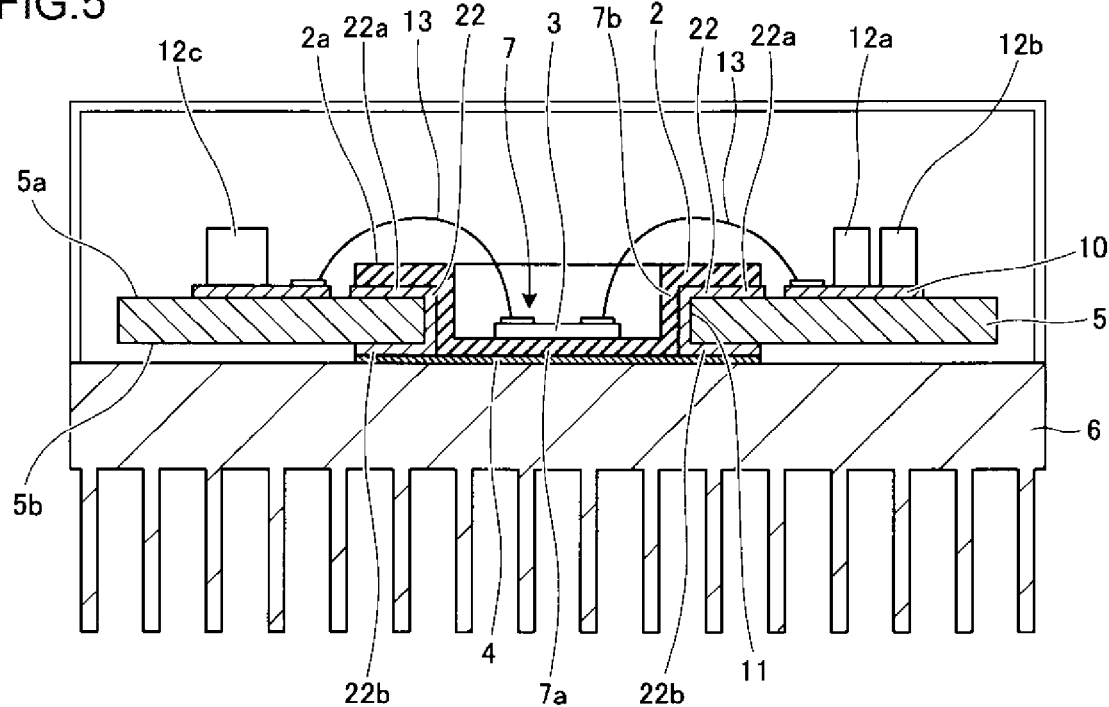
FIG. 5 is a sectional view showing a structure of a power conversion device according to a third embodiment.

FIG. 5 is a sectional view showing a structure of a power conversion device according to a third embodiment. In FIG. 5, a description will be given with the same signs in FIG. 1 for the same members in FIG. 1.

As shown in FIG. 5, a conductor portion 22 is formed on the inner wall surface of the through hole 11 provided in the printed circuit board 5. The conductor portion 22, extending as far as the upper surface 5a and lower surface 5b of the printed circuit board 5, forms an upper surface land portion 22a and a lower surface land portion 22b.

As shown in FIG. 5, the heat releasable insulating layer 4 is formed continuously from the lower surface of the bottom portion 7a of the metal case 2 to the lower surface of the lower surface land portion 22b. By so doing, when the metal case 2 and the printed circuit board 5 are integrally mounted directly to the heatsink 6, it is possible to appropriately secure the electrical insulation among the metal case 2 and lower surface land portion 22b and the heatsink 6.

In the embodiment shown in FIG. 5, rather than forming the heat releasable insulating layer 4 on the metal case 2 alone, as shown in FIGS. 2B and 2C, the continuous heat releasable insulating layer 4 is formed from the lower surface of the metal case 2 to the lower surface of the lower surface land portion 22b of the printed circuit board 5, using a mask, after the metal case 2 is fitted into the through hole 11 of the printed circuit board 5.

In the embodiment shown in FIG. 5 too, it comes to a condition such that the bottom portion 7a of the depressed portion 7 of the metal case 2, on which the power semiconductor element 3 is mounted, abuts against the upper surface of the heatsink 6 via the heat releasable insulating layer 4 superior in heat conductivity. Consequently, it is possible to sufficiently reduce the thermal resistance below the power semiconductor element 3, and thus possible to achieve a configuration having superior heat releasability. Therefore, as the power semiconductor element 3, it is possible to adopt a power semiconductor element which is lower in cost and smaller in area.

Also, as shown in FIG. 5, as the metal case 2 on which the power semiconductor element 3 is mounted, by being fitted into the through hole 11 of the printed circuit board 5 on which the circuit elements 12a, 12b, and 12c are mounted, is mounted directly to the heatsink 6, it is not necessary to house only a main circuit portion, which is formed of the power semiconductor element 3, in an independent case, as in the heretofore known power semiconductor module, and it is possible to connect the power semiconductor element 3 and the circuit patterns 10 of the printed circuit board 5 with the aluminum wires 13, because of which it is possible to effectively reduce the volume of the power conversion device compared with the heretofore known power conversion device.

In the third embodiment, the metal case 2 is used to mount the power semiconductor element 3. As the metal case 2 only has to be press-cut, it is possible to mold the metal case 2 by drawing, and thus possible to make it easy to manufacture the metal case 2. Moreover, the metal case 2, being a box-shape, can be simply fitted into the through hole 11 from the upper surface side of the printed circuit board 5, and it is possible to simply and appropriately integrate the metal case 2 and printed circuit board 5 by joining the two with an adhesive or by soldering with the metal case 2 being fitted in the through hole 11.

Also, as the power semiconductor element 3 is mounted on the upper surface of the bottom portion 7a of the depressed portion 7 of the metal case 2, it comes to a condition such that the power semiconductor element 3 is enclosed with the sidewall portion 7b of the metal case 2, and it is possible to enhance the function of protecting the power semiconductor element 3. Also, by mounting the power semiconductor element 3 on the upper surface of the bottom portion 7a of the depressed portion 7 of the metal case 2, it is also possible to dispose the power semiconductor element 3 within the plate thickness of the printed circuit board 5 in a condition in which the metal case 2 is fitted in the through hole 11 of the printed circuit board 5, and it is possible to shorten the distance between the power semiconductor element 3 and the heatsink 6, and thus possible to more effectively enhance heat releasability.

According to the above, in the third embodiment, as the metal case 2, on which the power semiconductor element 3 is mounted, is mounted to the heatsink 6 via the heat releasable insulating layer 4 made of a ceramics material, it is possible to provide a power conversion device superior in heat releasability compared with the heretofore known power conversion device. Furthermore, as the power semiconductor element 3, it is possible to adopt a power semiconductor element 3 which is lower in cost and smaller in area, and owing to the metal case 2 being fitted into the through hole 11 of the printed circuit board 5, resulting in a simplified electrical connection structure, it is possible to realize a reduction in size and height, and it is possible to achieve a reduction in cost.

What is claimed is:

1. A power conversion device comprising:
   a heat releasing heatsink;
   a printed circuit board provided on the heatsink, and having a through hole and wires;
   a metal case having a depressed portion fitted in the through hole and mounted on a top of the heatsink, the metal case including a bottom portion and a sidewall portion enclosing the depressed portion;
   a heat releasable insulating layer made of a ceramic material, and disposed between a bottom of the depressed portion and a top portion of the heatsink; and
   a power semiconductor element mounted in the depressed portion and electrically connected to the wires of the printed circuit boards,
   wherein the insulating layer is disposed to cover an entire lower surface of the bottom portion of the metal case and is in direct contact with the printed circuit board.

2. The power conversion device according to claim 1, wherein the heat releasable insulating layer has a heat conductivity of 1 to 300 W/m·K and a thickness of 10 to 500 µm.

3. The power conversion device according to claim 1, wherein the heat releasable insulating layer is formed of at least one kind of filler selected from the group consisting of silicon oxide, aluminum oxide, silicon nitride, aluminum nitride, or boron nitride fillers.

4. The power conversion device according to claim 1, wherein the heat releasable insulating layer is formed of at least one kind of deposited ceramic particles by a plasma spraying method.

5. The power conversion device according to claim 1, wherein the insulating layer is formed of at least one kind of deposited ceramic particles formed by an aerosol deposition method.

6. The power conversion device according to claim 1, wherein the printed circuit board directly contacts the heatsink.

7. The power conversion device according to claim 1, wherein the metal case includes a flange portion provided on an upper end of the sidewall portion and extending outwardly from the sidewall portion.

8. The power conversion device according to claim 7, Wherein the printed circuit hoard further includes a metal foil pattern provided on an upper surface thereof to face the flange portion, and the flange portion and the metal foil pattern being soldered together.

9. The power conversion device according to claim 7, further comprising a conductor portion formed on inner wall surfaces of the through hole of the printed circuit board, and including an upper surface land portion and a lower surface land portion,
   wherein the upper surface land portion is disposed between the printed circuit board and the flange portion of the metal case, and
   the insulating layer is arranged beyond a lower surface of the bottom portion of the metal case to cover the top portion of the heatsink, and the lower surface land portion is disposed between the printed circuit board and the insulating layer.

10. The power conversion device according to claim 7, wherein the insulating layer is disposed to cover side surfaces of the sidewall portion of the metal case.

11. The power conversion device according to claim 10, wherein the printed circuit board directly contacts the heatsink.

12. The power conversion device according to claim 11, wherein a distance between the lower surface of the bottom portion and a lower surface of the flange portion in a thickness direction of the printed circuit board is substantially equal to a thickness of the printed circuit board in the thickness direction.

13. The power conversion device according to claim 10, wherein the insulating layer is disposed to further cover a lower surface of the flange portion of the metal case.

14. The power conversion device according to 13, wherein the printed circuit board directly contacts the heatsink.

* * * * *

UNITED STATES PATENT AND TRADEMARK OFFICE
CERTIFICATE OF CORRECTION

PATENT NO. : 9,875,952 B2  
APPLICATION NO. : 15/066545  
DATED : January 23, 2018  
INVENTOR(S) : Kenji Okamoto Page 1 of 1

It is certified that error appears in the above-identified patent and that said Letters Patent is hereby corrected as shown below:

In the Specification

Please change Column 7, Line 37, from "12c forma power ..." to --12c form a power ...--.

Please change Column 11, Line 19, from "use anyone of ..." to --use any one of ...--.

Signed and Sealed this  
Thirty-first Day of July, 2018

Andrei Iancu  
*Director of the United States Patent and Trademark Office*